Feb. 12, 1963 R. H. KINGSTON ET AL 3,077,578

SEMICONDUCTOR SWITCHING MATRIX

Filed June 27, 1958

*INVENTORS*
A.L. McWHORTER
R.H. KINGSTON

*BY*

Edward D. Thomas

*AGENT*

United States Patent Office 3,077,578

Patented Feb. 12, 1963

3,077,578

SEMICONDUCTOR SWITCHING MATRIX

Robert H. Kingston, Lexington, and Alan L. McWhorter, Arlington, Mass., assignors to Massachusetts Institute of Technology, Cambridge, Mass., a corporation of Massachusetts Filed June 27, 1958, Ser. No. 745,145

10 Claims. (Cl. 340—166)

The present invention relates to matrix switching networks and more particularly to an improved compact array of switching elements composed of a single slab of semiconductor material having a plurality of ohmic line contacts disposed in parallel paths across each surface thereof, the line contacts on one face being at right angles to the line contacts on the second face in matrix fashion.

Large numbers of diodes are employed in digital computer switching systems for many purposes. Matrices composed of diode gating circuits account for much of the wiring complexity of such a computer and occupy a considerable portion of its total volume. One reason for the wiring requiring so much space is that connections can not be safely soldered close to miniature diodes without risk of effecting a permanent change in diode characteristic as a result of excessive heating.

The primary object of this invention is an improved semiconductor switching matrix having a large number of elements without the requirements of large bulk and complexity of manufacture.

Another object of the invention is the fabrication of a multiplicity of switching elements into a compact array which has utility in high speed computer network design.

When an impure semiconductor, doped with Group III or Group V impurities, is cooled to a temperature at which the donor or acceptor impurities are no longer ionized, the resistivity of the semiconductor becomes extremely large, as much as $10^7$ ohm-cm. or greater, for germanium at 4.2° K. However, if a sufficiently large electric field is then applied, the small number of free charge carriers present can attain enough energy between collisions to ionize the impurities by impact and create more carriers. This leads to an avalanche process, analogous to the breakdown in a gas, and produces a sharp drop in resistivity of many orders of magnitude as the impurities become ionized. This reversible non-destructive breakdown has been studied for germanium at relatively low fields and at low temperature by Sclar and Burstein, "Impact Ionization of Impurities in Germanium," Journal of Physical Chemical Solids, Pergamon Press, 1957, volume 2, No. 1, pages 1 through 23. Since the critical electric field is found to be of the order of 6 volts per cm. at 4.2° K. for low impurity concentration and constant over a large range of germanium room temperature resistivity, and since only ohmic contacts are required; it becomes possible to make large arrays of identical switches with symmetrical switching characteristics at the temperature of liquid helium.

In other words, indium-doped germanium has been shown to have an extremely high resistivity at temperatures low enough to freeze the carriers in the impurity levels. High conductivity can be attained at these low temperatures by applying an electric field of sufficient strength to cause impact ionization of the impurity centers.

The above and other objects and advantages of this invention will become more apparent from the following description and accompanying drawings in which.

Figure 1:
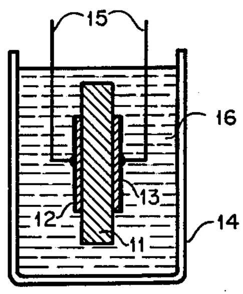
FIGURE 1 is a cross section of a single semiconductor switch element.
Figure 2:
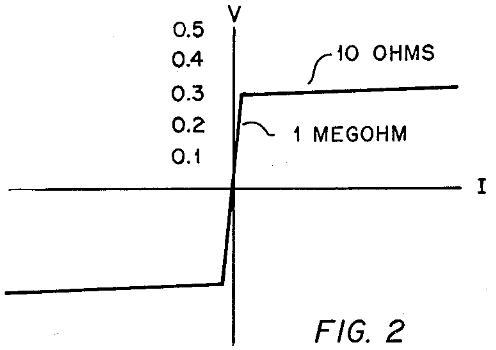
FIGURE 2 is a plot illustrating the characteristics of the switch structure of FIGURE 1 at 4.2° K.

Referring to FIGURE 1, a single semiconductor switching element is shown in which a wafer 11 of indium doped p-type germanium is shown with indium plated ohmic contacts 12 and 13 on the opposite faces of wafer 11. The device is shown immersed in a container 14 of liquid helium 16 and connected to an external circuit by electrical leads 15 soldered to contacts 12 and 13. With a wafer thickness of 0.5 mm. and acceptor density, $N_A=5\times10^{14}$ cm.$^{-3}$, at the temperature of liquid helium the device shows a resistance of approximately 1 megohm with voltages below 0.3 volt applied across contacts 12 and 13 of 1 mm. square area. FIGURE 2 shows graphically the characteristics of the switch. Above 0.3 volt, the device displays a resistance of about 10 ohms. The shunt capacitance of the device is low, of the order of 0.3 micro-micro-farad and the switching time between the high and low impedance states is found to be less than 10 milli-micro-seconds. A switch possessing these characteristics is attractive for digital computer switching matrix applications.

Figure 3:
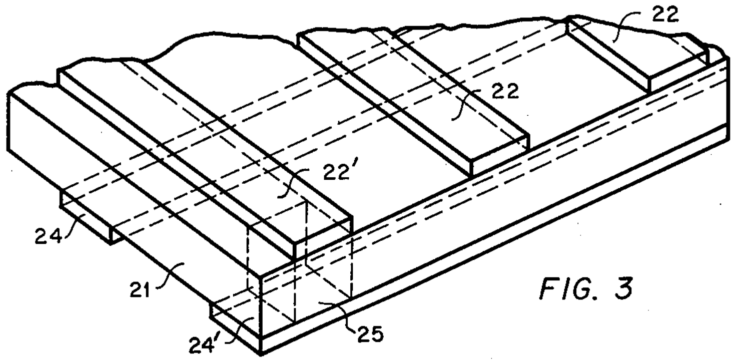
FIGURE 3 is a perspective view, not to scale, of one embodiment of present invention to form a switching matrix.

Since only the application of ohmic contacts to the surface of a slab of semiconductor material is involved, the fabrication of a large array of switches possessing identical characteristics, as described above, becomes a relatively easy task since well-known procedures can be employed at all steps of manufacture. Referring to FIGURE 3, a slab 21 of indium doped germanium is the starting point. The opposite faces may be spaced apart by 0.5 mm., although the slab thickness is not critical. The size of the array is limited only by the available dimension of the semiconductor material and the fineness with which ohmic line contacts can be applied. A 12 x 12 array of ohmic line contacts can easily be placed on a square-inch slab of germanium. The techniques of alloying or plating, the latter method being adaptable to printed circuit photoetching processes, are available and have been successfully employed. By way of illustration, after conventional cleaning operations, both surfaces of the slab can receive a thin indium plate in an indium sulphate plating bath. The slab is then coated with a commercial photo-resist and each face is exposed to light through a masking grid of parallel lines. After washing away the unexposed photo-resist, the slab is acid etched to remove indium plate from the unwanted areas, leaving parallel line ohmic contacts on each of the opposed surfaces. By arranging the parallel line contacts 22 on the upper surface of slab 21 perpendicular to the direction of the parallel line contacts 24 on the under surface of slab 21, a matrix of switching elements is formed, each individual element being formed by the semiconductor material present between the areas of intersection of the mutually perpendicular sets of parallel line ohmic contacts. A single such switching element 25 is shown by dotted lines in slab 21 at the intersection of line contacts 22' and 24'.

Since the device is to be operated at the temperature of liquid helium, there is the problem of securing good electrical contact to all of the plated line contacts. We have made contact to the indium electrodes by mechanical pressure, by solders or by solder pastes, but in general we prefer to make a soldered connection using a low melting point solder.

Figure 4:
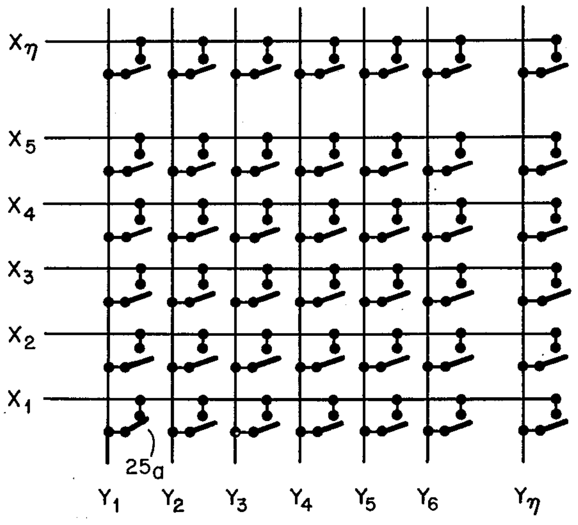
FIGURE 4 is a schematic diagram representing the circuit of the switching matrix of FIGURE 3.

Referring now to FIGURE 4, the equivalent circuit diagram of the structure of FIGURE 3 is shown. An array of X axis conductors, $X_1$, $X_2$, $X_3$, $X_4$ $X_5$ . . . $X_n$ is shown arranged in rows while an array of Y axis conductors, $Y_1$, $Y_2$, $Y_3$, $Y_4$, $Y_5$, $Y_6$ . . . $Y_n$ is shown arranged in columns. A switch is shown connected between X and Y conductors at each point of row and column intersection. Now if the assembly is held at the temperature of liquid helium, 4.2° K.; and a particular X row, $X_1$, and Y column, $Y_1$, is energized above the critical value of electric field of 6.0 volts per cm, then one and only one switching element 25*a* exists in an electric field of high enough strength to change state from high impedance to low impedance and selective switching between $X_1$ and $Y_1$ lines occurs. This state is shown by the closed switch connecting $X_1$ to $Y_1$. All other X lines remain isolated from the $Y_1$ line by high impedance elements while all other Y lines are similarly isolated from the $X_1$ line.

However, it is noted that the electric field established across the selected switch element may affect the resistivity of adjacent unselected elements to an extent related to the spacing between the ohmic line contacts. We have found that when the spacing between line contacts on the same face of the slab exceeds twice the slab thickness, each switch element can be turned "on" or "off" independently and without effect on the adjacent switch elements.

It should be noted that in the structure described above, conduction can occur at every intersection of an X line and a Y line upon the application of the proper bias voltage. While this arrangement of matrix connections has utility, there are computer applications, for example in a binary coded address matrix, where it is essential that there shall be no cross connection for certain points of matrix intersection. It is apparent that the printed circuitry techniques are particularly well adapted to obtain any desired configuration of matrix conductors on the opposed faces of the germanium slab. Conventional wiring methods are used to bridge interruptions in the continuity of some of the ohmic line contacts in order to complete the switching network.

It is also apparent that several matrices of the type described can be interconnected to obtain a single matrix much larger than can be advantageously applied to a single slab of germanium.

We also find that when germanium is doped with impurities such as gold or cobalt rather than Group III or V impurities, deeper lying impurity levels produce switching elements which can operate at the higher temperatures of liquid nitrogen. The ohmic contacts for use on gold-doped germanium can be made by gold plating and micro alloying on high resistivity p-type germanium. Tests made with a contact of this type showed a breakdown field of about 60 volts per cm. at the temperature of liquid nitrogen. Switching times for a device of this sort were found to be relatively slow, of the order of 1 microsecond.

Further, since the phenomenon of impact ionization is common to all semiconductor materials, the choice of doping elements, electrode materials, resistivity and semiconductor material is not limited to the specific examples which have been selected by way of example to illustrate the manner of practicing the present invention.

What is claimed is:

1. A matrix switching network comprising a wafer of impure semiconductor material having a plurality of spaced ohmic line contacts on opposite surfaces thereof, means for cooling the wafer below the temperature at which the impurity elements ionize and means for interconnecting selected contacts by the application thereto of a bias voltage having a magnitude greater than the critical value at which impact ionization occurs in said semiconductor material in the region between said selected contacts.

2. A switching network comprising a thin slab of impure semiconductor material having a plurality of parallel spaced ohmic line contacts on opposite surfaces thereof, the parallel line contacts on one face of said slab being perpendicular to the parallel line contacts on the other face of said slab to form a matrix, the spacing between adjacent ohmic line contacts on the same face of said slab being at least twice the thickness of said slab, means for cooling said slab below the temperature at which the impurity elements ionize, and means for applying an electric field at the intersection of selected line contacts on opposite faces of said slab to initiate conduction by impact ionization in the semiconductor material lying between said selected line contacts.

3. A matrix switching network comprising a wafer of indium-doped germanium having a plurality of spaced ohmic line contacts on opposite surfaces thereof arranged in rows and columns to form a matrix, means for cooling said wafer to a temperature at which the indium atoms are deionized, and means for applying an electric field across a selected matrix intersection to establish a zone of conductivity in said germanium lying at said selected matrix intersection by the impact ionization of said indium atoms.

4. A switching network comprising a thin slab of indium-doped germanium having a plurality of parallel spaced plated indium ohmic line contacts on opposite faces thereof, the parallel line contacts on one face of said slab being perpendicular to the parallel line contacts on the second of said faces to form a matrix, the spacing between ohmic line contacts on the same surface of said slab being at least twice the thickness of said slab, means for cooling said slab to the temperature of liquid helium to freeze the carriers in the impurity levels and means for applying an electric field at the intersection of selected lines on opposite faces of said slab to initiate conduction in the germanium lying between said selected lines by impact ionization of the impurity centers.

5. A matrix switching network comprising a wafer of indium-doped germanium having a first plurality of parallel ohmic line contacts on one surface thereof representing the X coordinates of a matrix network and a second plurality of parallel ohmic line contacts on the second face of said wafer arranged perpendicular to said first plurality of line contacts to represent the Y coordinates of a matrix network, means for obtaining a state of high resistivity in said wafer by cooling to a temperature of 4.2° K. to freeze the carriers in the impurity levels, and means for applying an electric field in excess of 6 volts per centimeter across selected matrix intersections to establish a state of low resistivity in a zone of germanium lying between each selected matrix intersection by impact ionization of said indium atoms.

6. A matrix switching network comprising a wafer of semiconductor material containing impurity element charge carriers, a plurality of spaced ohmic line contacts on each surface of said wafer, means placing said wafer in state of high resistivity by cooling said wafer to level of temperature at which said impurity element deionizes, and means establishing a zone of low resistivity in the semiconductor material lying between selected line contacts on opposite surfaces of said wafer by applying to said selected contacts a bias voltage exceeding a critical value at which ionization by impact occurs in said semiconductor material.

7. A matrix switching network comprising a thin slab of p-type germanium containing indium as the impurity element charge carrier, a plurality of parallel spaced ohmic line contacts on opposite faces of said slab, the parallel line contacts on one of said faces being perpendicular to the parallel line contacts on the second of said faces to form a matrix, the spacing between adjacent line contacts on the same face of said slab being at least twice the thickness of said slab, means for maintaining said slab at a temperature level at which said indium is deionized, and means for ionizing indium impurity centers lying in a zone defined by the intersection of selected ohmic line contacts on opposite faces of said slab by the impact ionization of said impurity centers in an electric field imposed by the application of a voltage bias to said selected contacts.

8. A matrix switching network comprising a thin slab of p-type indium doped germanium having a first plurality of parallel ohmic line contacts on one surface thereof and a second plurality of parallel ohmic line contacts on the second surface thereof arranged perepndicular to said first plurality of line contacts whereby a matrix network of conductors is obtained, the spacing between adjacent line contacts on the same surface of said slab being at least twice the thickness of said slab, means for maintaining said slab at a temperature level at which said indium is deionized and said slab possesses high electrical resistivity, and means for establishing zones of low electrical resistivity in the p-type germanium lying at selected matrix intersections by applying thereto an electric field having a magnitude causing an avalanche breakdown therein by impact ionization of indium atoms.

9. A semiconductor switching network comprising a thin slab of germanium containing indium as a significant impurity element to provide p-type conductivity throughout said slab, a multiplicity of spaced ohmic line contacts arranged in rows and columns on opposite faces of said slab respectively, means for cooling said slab to a temperature at which indium impurity atoms deionize and said slab is in a state of high impedance, and means for interconnecting selected line contacts on one surface of said slab with selected line contacts on the other surface of said slab by the application of a bias voltage thereto of sufficient magnitude to cause a reversible non-destructive avalanche breakdown in a limited zone by the impact ionization of indium impurity atoms lying between said selected contacts.

10. A semiconductor switching network comprising a thin slab of semiconductor material containing an excess of charge carriers of predetermined charge to provide a single type of conductivity throughout said slab, a multiplicity of spaced ohmic line contacts arranged in rows and columns respectively on opposite faces of said slab, means for cooling said slab to a temperature at which said charge carriers deionize and said slab is in a state of high impedance, and means for interconnecting selected line contacts on one surface of said slab with selected line contacts on the other surface of said slab by the application of a bias voltage thereto of sufficient magnitude to cause a reversible non-destructive avalanche breakdown in a limited zone by the impact ionization of said charge carriers lying between said selected contacts.

References Cited in the file of this patent

UNITED STATES PATENTS

| | | |
|---|---|---|
| 1,779,748 | Nicolson | Oct. 28, 1930 |
| 2,592,683 | Gray | Apr. 15, 1952 |
| 2,655,625 | Burton | Oct. 13, 1953 |
| 2,666,884 | Ericsson et al. | Jan. 19, 1954 |
| 2,717,373 | Anderson | Sept. 6, 1955 |
| 2,860,322 | Stadler | Nov. 11, 1958 |
| 2,891,160 | Le Blond | June 16, 1959 |
| 2,979,668 | Dunlap | Apr. 11, 1961 |

OTHER REFERENCES

Journal of Physical Chemical Solids, vol. 2, pp. 1–23 (by Sclar et al.), 1957.

IBM Journal, October 1957, pp. 295–302, Crowe, Trapped-Flax Superconducting Memory.